United States Patent [19]
Amanai

[11] Patent Number: 5,499,212
[45] Date of Patent: Mar. 12, 1996

[54] SEMICONDUCTOR MEMORY DEVICE HAVING A BIAS CONTROL CIRCUIT FOR ERASE VOLTAGE BLOCKING TRANSISTOR

[75] Inventor: Masakazu Amanai, Tokyo, Japan

[73] Assignee: NEC Corporation, Tokyo, Japan

[21] Appl. No.: 360,943

[22] Filed: Dec. 21, 1994

[30]     Foreign Application Priority Data

Dec. 22, 1993  [JP]  Japan .................... 5-324975

[51] Int. Cl.⁶ ................................ G11C 13/00
[52] U.S. Cl. ............... 365/218; 365/185.13; 365/185.23
[58] Field of Search .................. 365/218, 900, 365/189.01, 230.01, 227

[56]              References Cited

U.S. PATENT DOCUMENTS 5,400,286  3/1995  Chu et al. ........................ 365/218

*Primary Examiner*—Terrell W. Fears
*Attorney, Agent, or Firm*—Sughrue, Mion, Zinn, Macpeak & Seas

[57]              ABSTRACT

The semiconductor memory device according to this invention includes a plurality of word lines each connected to an electrically writable and erasable memory cell, a first terminal which goes to the active level when the word line is selected, a second terminal to which is applied a read voltage during the period of read operation and a write voltage which is higher than the read voltage during the period of write operation, a transfer gate provided between the second terminal and a node and has its control terminal connected to the first terminal, bias supply means which connects the node to a power terminal when the first terminal is at the inactive level and brings the node to the cutoff state when the first terminal is at the active level, a negative voltage generation circuit which supplies a negative voltage to the word line during the period of data erase operation, a transistor provided between the node and one end of the word line, and a bias control circuit which supplies a bias voltage which brings the transistor to the off-state during the period of data erase operation and brings the transistor to the on-state during the periods of write and read operations, wherein the bias control circuit is so set as to give the bias voltage generated when the first terminal is at the active level lower compared with the bias voltage generated when the first terminal is at the nonactive level.

8 Claims, 6 Drawing Sheets

2

SEMICONDUCTOR MEMORY DEVICE HAVING A BIAS CONTROL CIRCUIT FOR ERASE VOLTAGE BLOCKING TRANSISTOR

BACKGROUND OF THE INVENTION

Field of the Invention

The present invention relates to a semiconductor memory device, and more particularly to a semiconductor memory device such as a flash memory equipped with a transistor for preventing the transmission of a negative potential to the side of a column selection circuit when the negative voltage for data erasure is applied to memory cells that can be electrically written and erased.

BRIEF SUMMARY OF THE INVENTION

Description of the Prior Art

One of the representative write and erase methods for an electrically programmable (writable) and erasable memory cell with a floating gate is to write data by applying a high voltage to the control gate of the transistor constituting the memory cell, and erase data by applying a voltage with polarity opposite to that used for the data write. The voltage for write is higher than the power supply voltage for the internal circuits including a column selection circuit. These internal circuits include a transistor for blocking the write voltage in order to prevent the high voltage for data write being applied to the internal circuits. If the high voltage for data write is applied to the internal circuits, it is necessary to raise the breakdown voltage accordingly, which brings about deterioration in the operating speed due to increase in the thickness of the insulating film, and an increase in the chip area. Moreover, the internal circuits also include a transistor for blocking the erase voltage in order to prevent, at the time of erasure, the voltage with polarity opposite to that used for the data write being transmitted to the transistor for blocking the write voltage. If the voltage with the opposite polarity is transmitted to the transistor for blocking the write voltage, the P-N junction part of the transistor is biased in the forward direction and brings about an increase in the current consumption, a deterioration in the erase voltage or the like.

An example of the conventional EEPROM type semiconductor memory device equipped with a transistor for blocking the write voltage and a transistor for blocking the erase voltage is shown in FIG. 1.

This semiconductor memory device has a memory cell array in which a plurality of electrically programmable and erasable memory cells MC (only one of them is shown in FIG. 1) having a floating gate are arrayed in matrix form in row and column directions. A predetermined voltage is supplied to one of selected row line WL among a plurality of WLs (only one of them is shown in FIG. 1) connected to control gates of the field effect transistors constituting the plurality of memory cells. A row election signal RS (a signal whose low level is active) from a row decoder (not shown) is supplied to an inverter 2 equipped with an N-channel type transistor Q21 and a P-channel type transistor Q22. A P-channel type transistor Q2 which receives the row selection signal RS to its gate, receives to its source a write voltage Vpp at the time of write operation and a read voltage Vcc at the time of read operation, and supplies the write voltage Vpp or the read voltage Vcc to the corresponding row line WL. A power supply voltage selection circuit 11 connected to the source of the transistor Q2 selects and outputs Vpp or Vcc in response to a selection signal S1. A transistor Q1a whose source and drain are connected to the output end of the inverter 2 and the drain of the transistor Q2, respectively, and whose gate receives a bias voltage Vb1 of predetermined level, blocks at the time of the write operation the transmission of the write voltage Vpp to the side of a row selection circuit which includes the inverter 2 and the row decoder. A P-channel type transistor Q3a for blocking the erase voltage has its source and the drain connected to the drain of the transistors Q1a and Q2 and the corresponding row line WL, respectively, and receives a bias voltage of a predetermined level to its gate. A bias circuit 12 selects, at the time of the write and the read operations, a negative bias voltage Vb2 in response to a selection signal S2, and selects the ground voltage Vb3 at the time of the erase operation, and supplies the signal to the gate of the transistor Q3a. Accordingly, the transistor Q3a is always in the on-state at the the data write and the data read operations and transmits the voltage level of the drain (referred to as node N1 hereinafter) of the transistor Q2 to the row line WL, and goes to the off-state at the data erase operation to block the transmission of the erase voltage supplied to the row line WL to the transistor Q1a. At the erase operation, a negative voltage for erasure generation circuit 3 supplies a negative voltage to a prescribed row line WL.

Next, the operation of this semiconductor memory device will be described. FIG. 2 is a voltage waveform diagram for various parts to describe the operation of the semiconductor memory device.

First, the case in which the row line WL in the write operation is in the non-selected situation will be described.

Now, at the time t0, the row selection signal RS is at the level of the power supply Vcc which is at the inactive level so that the transistor Q22 is in the off-state while the transistor Q21 is in the on-state. Moreover, during the write period, the write voltage Vpp is applied to the source of the transistor Q2, and it is set to satisfy the condition Vpp–Vcc> Vt(Q2), where Vt(Q2) represents the threshold of the transistor Q2, so that the transistor Q2 is in the on-state. Further, a bias voltage Vb1 which sets the transistor Q1a to be in the on-state is applied to the gate of the transistor Q1a. Accordingly, a certain current flows from the power supply for write toward the ground potential point through the transistors Q2, Q1a and Q21, and the voltage of the node N1 and the potential Vio of the output end of the inverter 2 become to have certain constant values. The potential of the node N1 at that time is set so as to be substantially equal to the level of the ground potential. In addition, during the write period, a negative bias voltage Vb2 satisfying the condition Vb2< –|Vt(Q3a)| where Vt(Q3a) represents the threshold of the transistor Q3a, is applied by the bias circuit 12 to the gate of the transistor Q3a, to set the transistor Q3a to be in the on-state all the time, so that the potential of the row line WL becomes substantially equal to the ground potential same as the potential of the node N1.

Even at the time t1 with the passage of the time, the row selection signal RS does not undergo a change, and hence the potentials of the various nodes remain unchanged from the values at the time t0.

Next, the case in which the row line WL is selected will be described.

As the time passes t1 and the row selection signal RS changes from the level of the power supply voltage Vcc to the active level of the ground potential, the transistor Q21 goes to the off-state and the transistor Q22 goes to the on-state, so that the output end (Vio) of the inverter 2 is charged up to the level of the power supply voltage Vcc. In addition, since the transistor Q2 is in the on-state, the node N1 is charged to the level of the write voltage Vpp. Since the bias voltage Vb1 is set to satisfy the condition Vb1−Vcc< Vt (Q1a), where Vt(Q1a) represents the threshold of the transistor Q1a, the transistor Q1a is in the cut off-state, and the potential Vio of the output end of the inverter 2 will not be raised beyond the level of the power supply voltage Vcc. In other words, during the period of the write operation, the transistor Q1a carries out the function of electrically isolating the Vcc system circuit from the Vpp system circuit. Following that, the potential of the row line WL will be raised to the level of the write voltage Vpp through the transistor Q3a whose gate is biased by the negative bias voltage Vb2 and is always in the on-state during the period of the write operation.

It is to be noted that during the period of the write as well as during the period of the read, the negative voltage for erasure generation circuit 3 is not actuated and will not affect in the slightest extent the operation of the circuits on the side of the row selection circuit.

Next, the operation during the data erase period will be described.

The negative voltage for erasure generation circuit 3 is actuated during the period of erasure of stored data in the memory cell MC. If at that time the transistor Q3 is in the on-state and the negative voltage is transmitted to the node N1, the P-N junction part between a diffused layer of the transistor Q1a connected to the node N1 and a P-type well or a P substrate is biased in the forward direction to increase the output current of the negative voltage for erasure generation circuit 3, which results in fluctuations in the negative voltage. The selection circuit 12 outputs a voltage Vb3 satisfying the condition Vb3> −|Vt(Q3a)| to the gate of the transistor Q3a in response to a selection signal S2 in order to turn off the transistor Q3a. That is to say, during the period of the erase operation, the transistor Q3a functions as a circuit for isolating the negative voltage for erasure (for blocking the erase voltage) for electrically isolating the negative voltage from the transistor Q1a.

The gate of the transistor Q3a is always biased by the bias voltage Vb2 during the write and the read operations. Because of that, during the period of the write operation, very large voltages are applied between the gate and the source and between the gate and the drain, of the transistor Q3a connected to the selected row line WL.

Describing the situation more specifically by citing memerical values, the write voltage Vpp is 12 V, and the bias voltage Vb2 is −5 V during the period of the write operation. In that case, the voltage between the gate and the source and the voltage between the gate and the drain, namely, the voltage applied to the gate oxide film, of the transistor Q3a connected to the selected row line WL, amounts even to 17 V. It is said generally that the maximum electric field Emax applied to the gate oxide film of a MOS transistor is 4 MV/cm at the most. Since the electric field strength E can be represented by $$E=|Vgs|/tox=|Vgd|/tox, \quad (1)$$

where Vgs and Vgd are the voltage between the gate and the source and the voltage between the gate and the drain, respectively, and tox is the thickness of the gate oxide film, the minimum thickness toxmin of the gate oxide film needed for preventing the application of an excess electric field to the gate oxide film can be given by toxmin= |Vgs|/Emax=|Vgd|/Emax=17 (V)/4 (MV/cm)=42.5 nm Reduction of the thickness tox of the gate oxide film below this value invites the breakage of the gate oxide film. According to the result of a similar computation for the thickness of the gate oxide film required for the Vcc system for which the maximum value of the voltage between the gate and the source and the voltage between the gate and the drain is about 6 V, gives a value of about 15 nm. This result shows how big the value of 42.5 nm for the thickness of the gate oxide film is. At the same time, this means that the current driving capability of the transistor Q3a is overwhelmingly inferior for the Vcc system transistor.

Furthermore, a high voltage is applied also to the transistor Q1a for isolating the Vcc system and the Vpp system (for blocking the write voltage). For example, when Vb1=3 (V), Vcc= 6 (V) and Vpp=12 (V), if the row line WL is in the selected state, a high voltage of a maximum of 9 V is applied to the gate oxide film of the transistor Q1a. Although this value is smaller than the maximum voltage of 17 V which is applied to the gate oxide film of the transistor Q3a for blocking the erase voltage, it has to be decided either to use a gate oxide film with the same thickness as that of the transistor Q3a or to form a gate oxide film with different thickness by adding a new process, because it is not possible to use the thin gate oxide film of the Vcc system transistor which is set for the maximum voltage of 6 V. Since, however, addition of a new process incurs an increase in the production cost, the gate oxide film of the transistor Q1a for isolation of the Vcc system and the Vpp system is ordinarily given the same thickness as that of the transistor Q3a that uses the erase voltage. Consequently, the current driving capability of the transistors Q1a and Q3a is deteriorated and the charging and the discharging times of the row line WL become long, and, as a result, it leads to the problem that the read speed of stored data is reduced.

OBJECT OF THE INVENTION

It is therefore the object of the invention to provide a semiconductor memory device which can increase the current driving capability and improve the read speed of stored data by reducing the thickness of the gate oxide film of the transistor for blocking the write voltage and the transistor for blocking the erase voltage.

SUMMARY OF THE INVENTION

The semiconductor memory device according to this invention includes a plurality of word lines each connected to an electrically writable and erasable memory cell, a first terminal which goes to an active level when the word line is selected, a second terminal to which is applied a read voltage at read operation and applied a write voltage which is higher than the read voltage at write operation, a transfer gate provided between the second terminal and a node, with its control terminal connected to the first terminal, bias supply means which connects the node to a power terminal when the first terminal is at a nonactive level and goes to the cutoff state when the first terminal is at the active level, a negative voltage generation circuit which supplies a negative voltage to the word line during the period of the data erase operation, a transistor provided between the node and the word line, and a bias control circuit which supplies a bias voltage which brings the transistor to the off-state during the period of the data erase operation and brings the transistor to the on-state during the periods of the write and read operations, wherein the bias control circuit regulates the bias voltage generated when the first terminal is in the active level to be lower than the bias voltage generated when the first terminal is in the nonactive level.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 3:
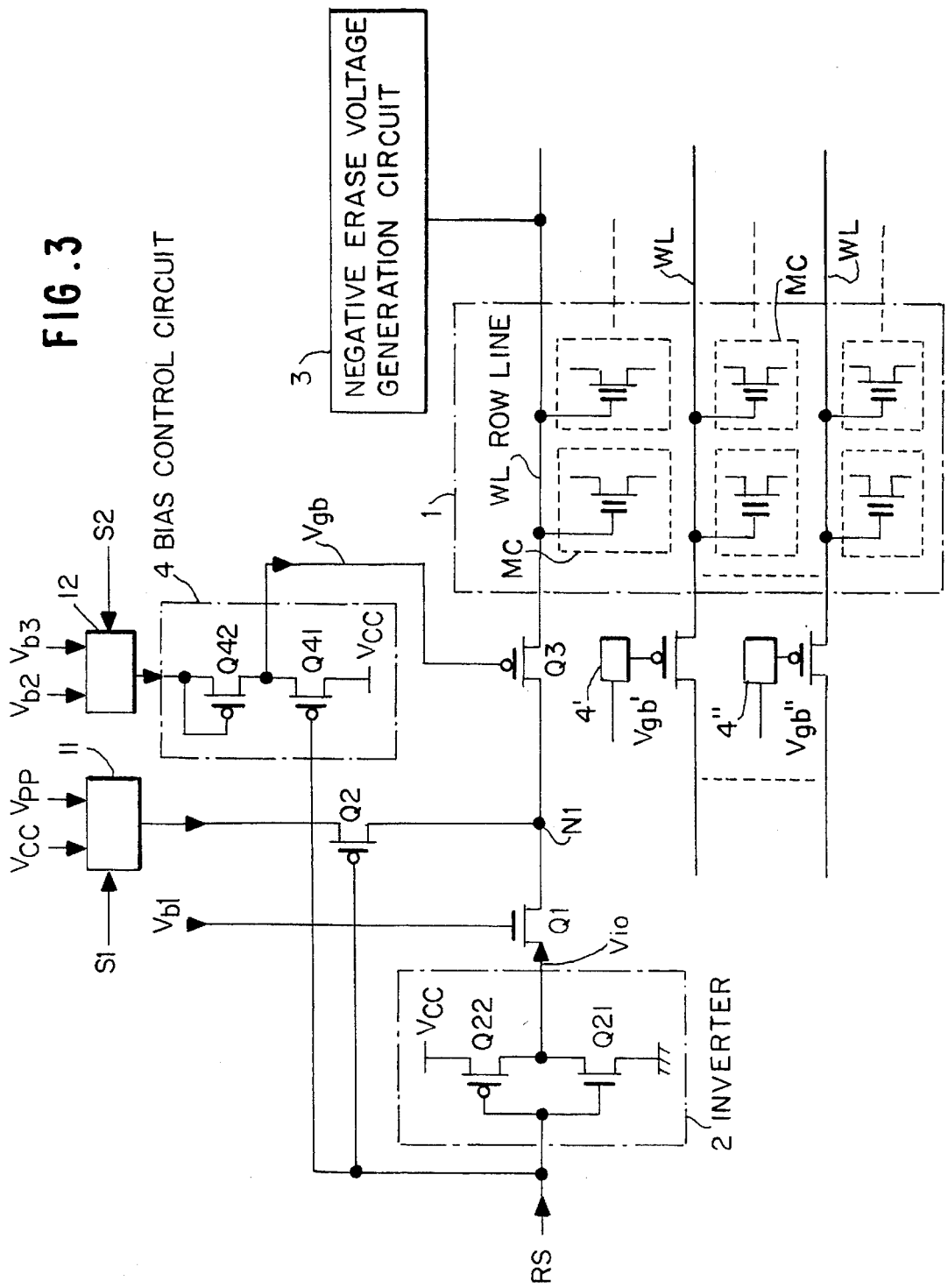
FIG. 3 is a circuit diagram of the semiconductor memory device showing a first embodiment of the invention.

Referring to FIG. 3, the first embodiment of this invention will be described. Components the same as those of the conventional device described in conjunction with FIG. 1 will be assigned the same reference numerals to omit further detailed description. The feature of this embodiment resides in the fact that a bias control circuit 4 is provided between a selection circuit 12 and the gate electrode of a P-channel type transistor Q3 for blocking the erase voltage.

The bias control circuit 4 includes a P-channel type transistor Q42 having a predetermined threshold voltage, with its source and gate connected to the output of the selection circuit 12, and a P-channel type transistor Q41 with its source connected to the drain of the transistor Q42, its drain receives a power supply voltage Vcc and its gate is supplied with a row selection signal RS, and its output Vgb is supplied to the gate of the transistor Q3.

Figure 4:
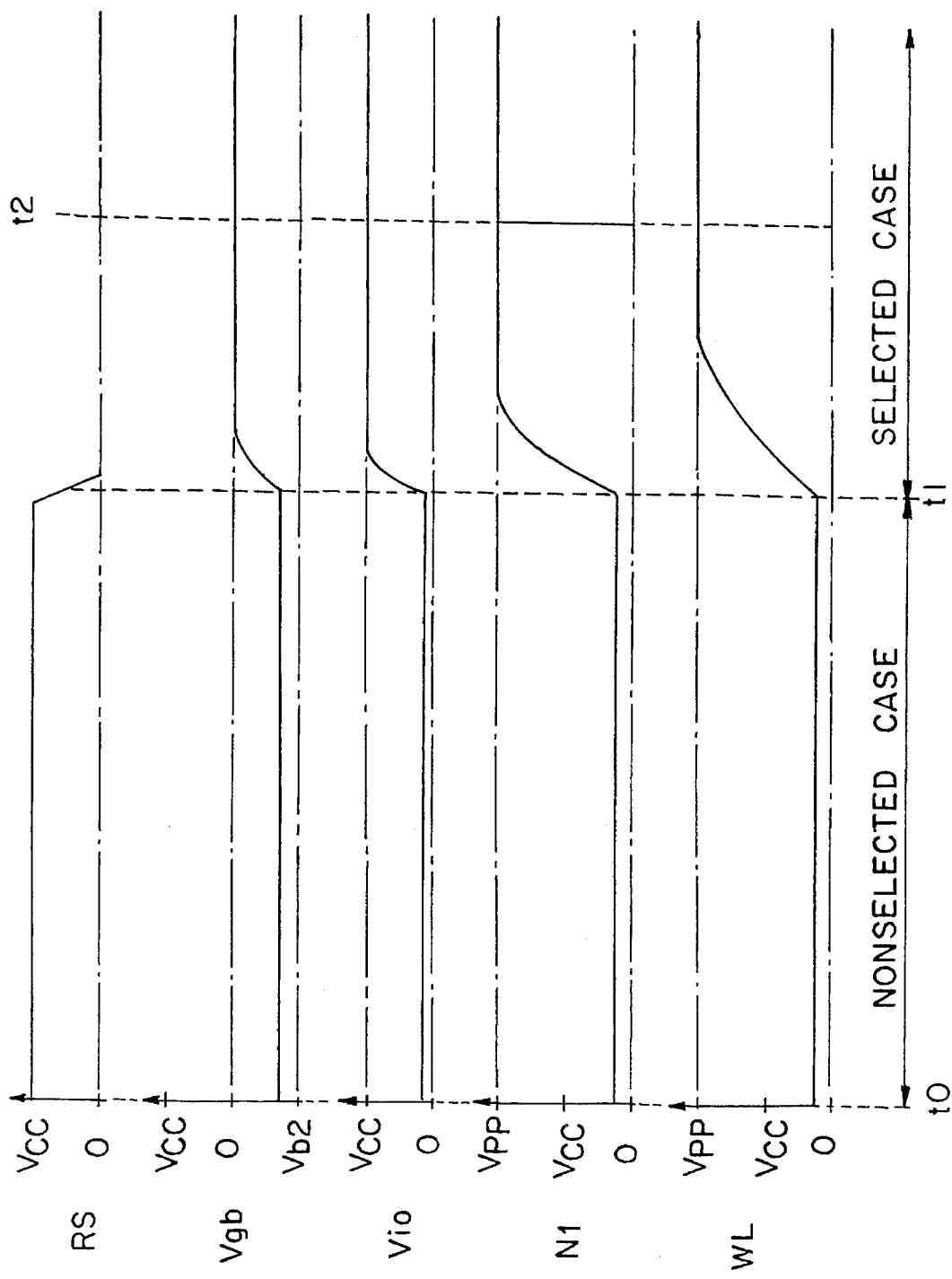
FIG. 4 is a waveform diagram showing the operation of the semiconductor memory device illustrated in FIG. 3.

Next, referring also to FIG. 4, the operation of this embodiment will be described. First, the case in which the row line WL during the period of the write operation is in the nonselected state.

Figure 1:
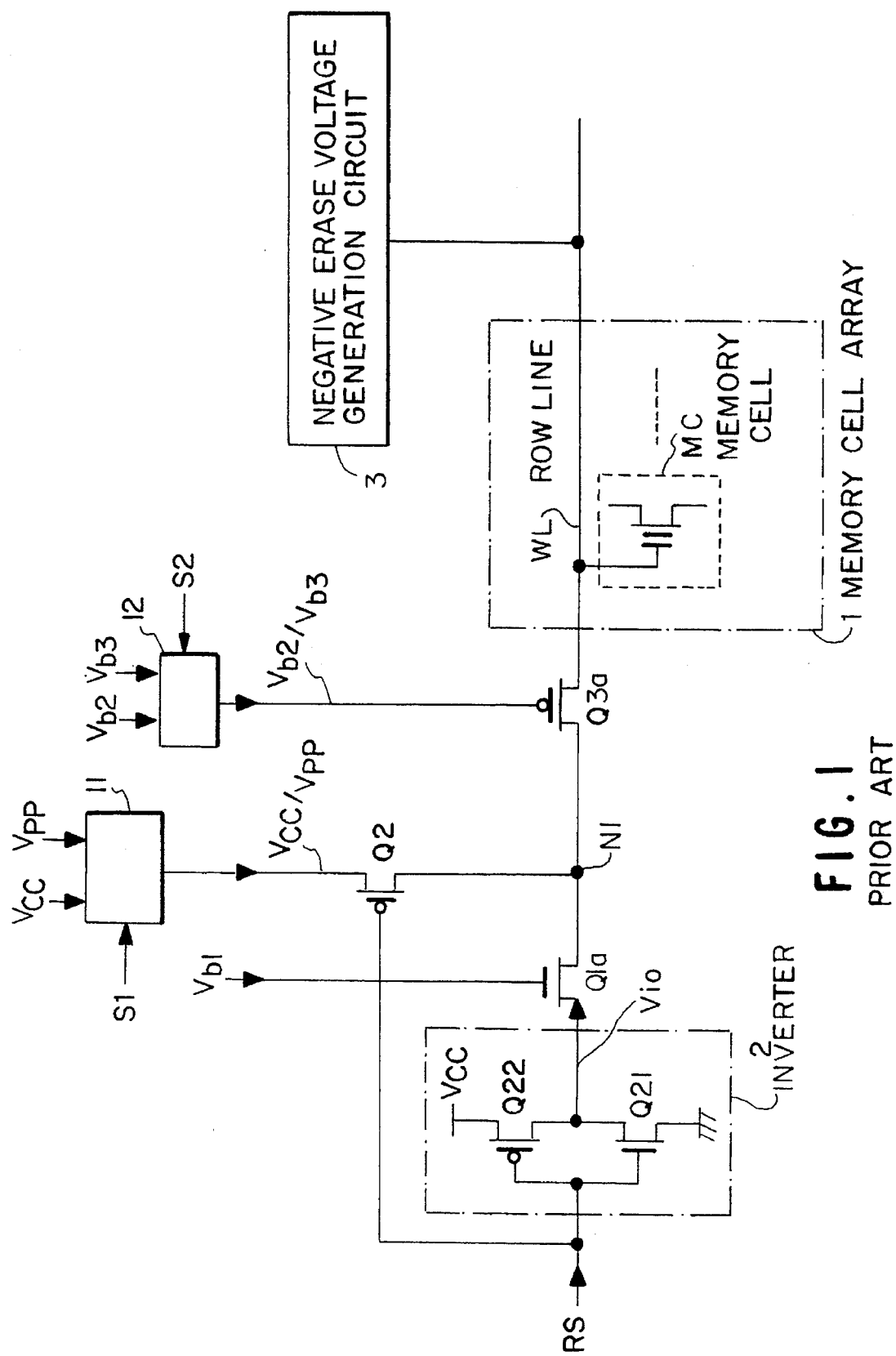
FIG. 1 is a circuit diagram showing a conventional semiconductor memory device.
Figure 2:
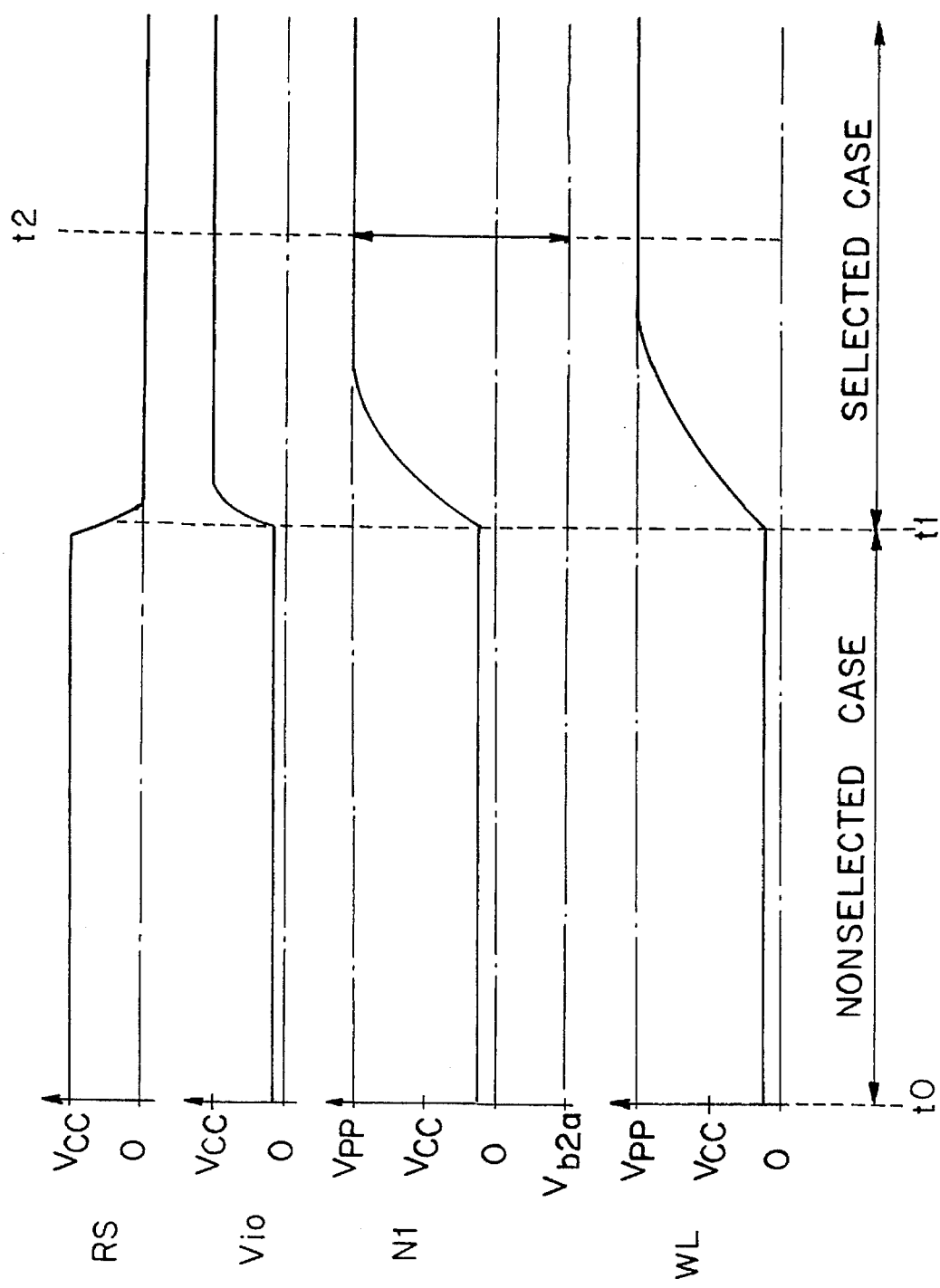
FIG. 2 is a waveform diagram showing the operation of the semiconductor memory device illustrated in FIG. 1.

At the time t0, the row selection signal RS is at the level of the power supply voltage Vcc, the conditions of the transistors Q1, Q2, Q21 and Q22 are similar to those of the corresponding transistors in the conventional device shown in FIG. 1 for the row line nonselection during the period of the write operation, and the potential at the node N1 and the potential Vio of the output end of the inverter 2 have certain constant values. At that time, the potential of the node N1 is set to be substantially equal to the ground potential. Further, the selection circuit 12 selectively outputs the voltage Vb2, and the transistor Q41 is in the off-state, so that the potential Vgb at the output end of the bias control circuit 4 becomes Vb2+ |Vt(Q42)|, where Vt(Q42) is the threshold of the transistor Q42. Accordingly, the transistor Q3 goes to the on-state, and the potential of the row line WL becomes substantially equal to the ground potential, the same as the potential of the node N1.

Even at the time t1 with the passage of the time, the row selection signal RS does not undergo a change, and hence, the potentials at the various nodes remain the same as those at the time t0.

Next, the case in which the row line WL is selected will be described.

With the passage of the time after t1, as the row selection signal RS changes from the level of the power supply voltage Vcc to the level of the ground potential, the transistor Q21 goes to the off-state and the transistor Q22 goes to the on-state so that the output end (Vio) of the inverter 2 is charged up to the level of the power supply voltage Vcc. In addition, since the transistor Q2 is in the on-state, the node N1 is charged up to the level of the write voltage Vpp. At that time, the transistor Q1 goes to the off-state, and performs the function of electrically isolating the Vcc system circuit and the Vpp system circuit. Therefore, the potential Vio of the output end of the inverter 2 will not be raised beyond the level of the power supply voltage Vcc. The transistor Q41 goes to the on-state as the row selection signal RS goes to the ground potential level, and a current flows between the power supply voltage Vcc and the bias voltage Vb2 via the transistors Q41 and Q42, bringing the potential Vgb at the output end of the bias control circuit 4 to a certain constant value. In this embodiment, the potential Vgb at that time is set to be substantially equal to the ground potential. Accordingly, the transistor Q3 keeps to maintain the on-state and the potential of the row line WL goes up to the level of the write voltage Vpp.

When the charging of the row line WL is completed at the time t2, the gate potential Vgb of the transistor Q3 becomes substantially equal to the ground potential (0 V), and both potentials of the drain and the source become equal to the level of the write voltage Vpp. If the write voltage Vpp is taken to be 12 V, the voltage between the gate and the source and the voltage between the gate and the drain of the transistor Q3 for blocking the erase voltage turn out to be about 12 V. In that case, the minimum value toxmin of the thickness of the gate oxide film necessary for preventing the application of an excessive electric field to the gate oxide film as determined by Eq.(1) is given by $$toxmin = 30.0 \text{ (nm)}$$

This value corresponds to 12/17 of the toxmin value for the conventional device. Since the gate oxide film of the transistor Q1 for isolation of the Vcc system circuit, namely, the transistor for blocking the write voltage is also formed in the same step in which the transistor Q3 is formed, the minimum thickness of the gate oxide film for the transistor Q1 is also equal to 12/17 of the conventional value. Accordingly, it becomes possible to bring the current driving capability of both transistors Q1 and Q3 to 17/12 times, that is, about 1.4 times, that of the conventional device, shorten the charging and discharging times at the time of read operation, and obtain a semiconductor memory device with high read speed.

It is to be mentioned that the situation during the period of the read operation is similar to that during the write operation except for the fact that the voltage supplied to the source of the transistor Q2 is Vcc. Further, during the period of the erase operation, the selection circuit 12 selectively outputs Vb3 (= ground voltage), so that the output Vgb of the bias control circuit 4 becomes Vb3+ |Vt(Q42)|, and the transistor Q3 goes to the off-state.

Figure 5:
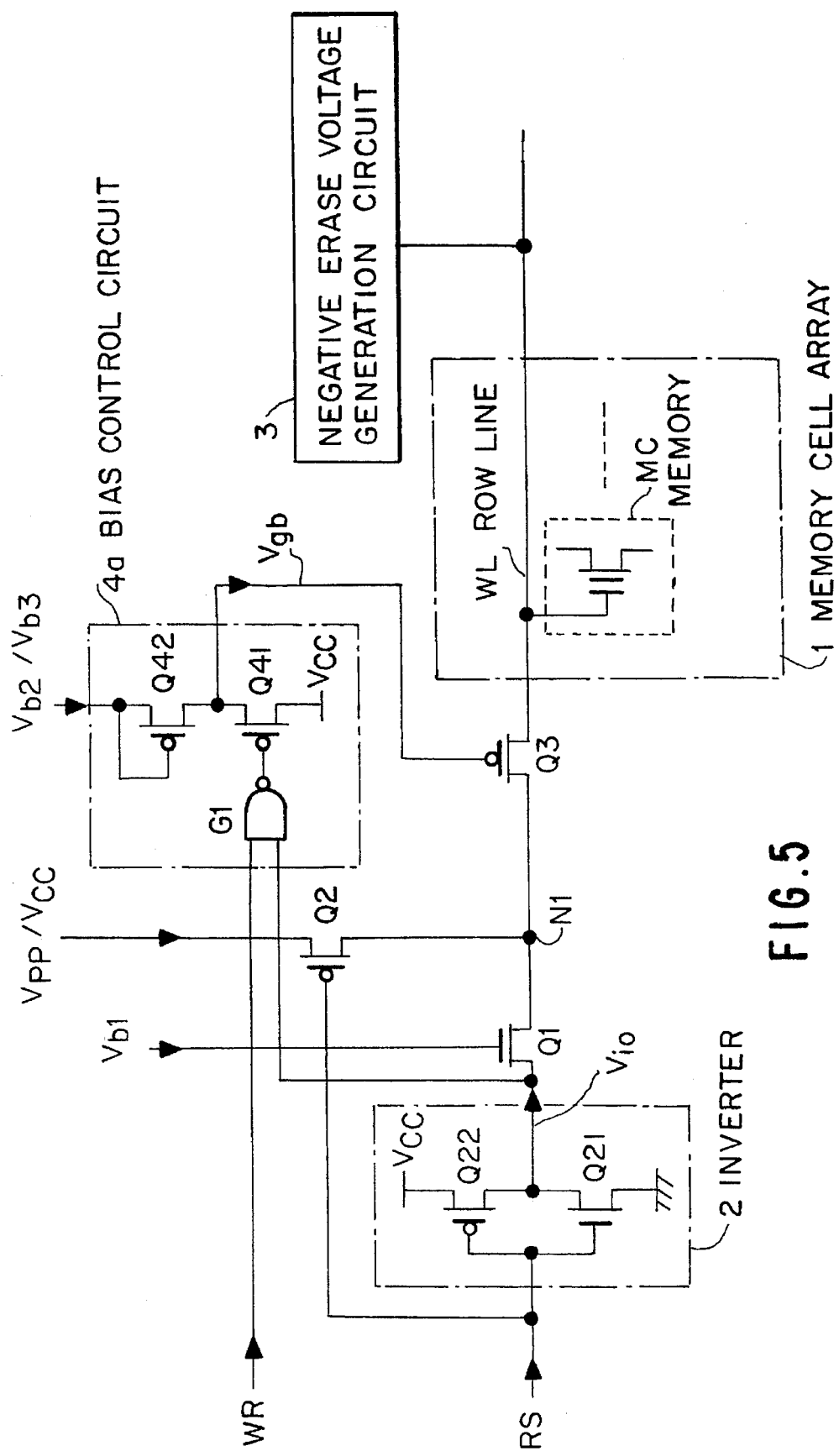
FIG. 5 is a circuit diagram of the semiconductor memory device showing a second embodiment of the invention.

FIG. 5 is a circuit diagram of the second embodiment of the invention. The difference of the second embodiment from the first embodiment shown in FIG. 1 resides in the fact that the output signal of a NAND gate G1, which receives a write/read mode signal WR into one of the input ends, and receives the output signal of the inverter 2 into the other input end, is supplied to the gate of the transistor Q41.

Figure 6:
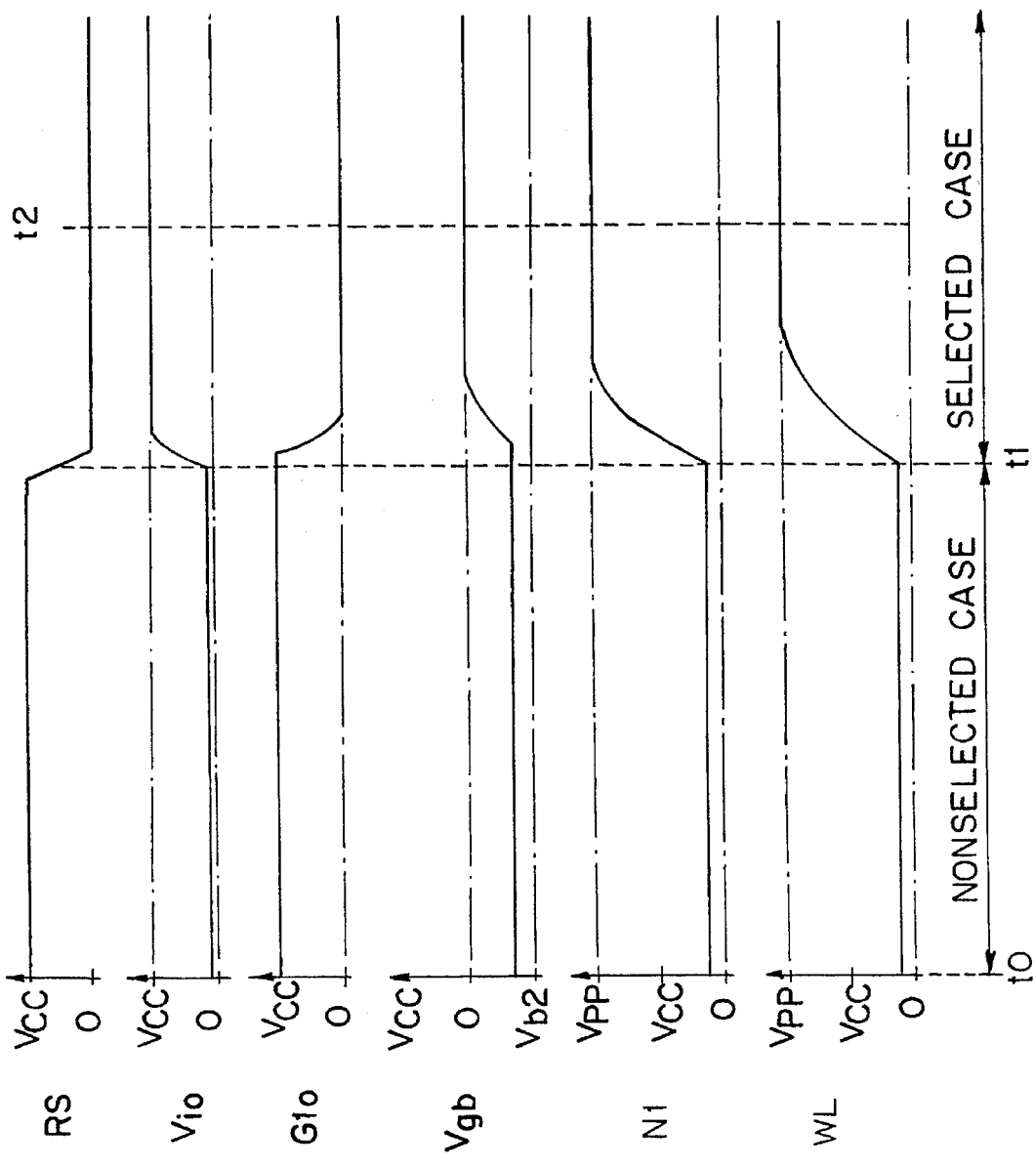
FIG. 6 is a waveform diagram showing the operation of the semiconductor memory device illustrated in FIG. 5.

Next, the operation of this embodiment will be described. FIG. 6 is a diagram of the voltage waveform for various parts during the period of the write operation to describe the operation of this embodiment.

During the period of the write operation, the write/read mode signal WR is always at the level of the power supply voltage Vcc so that the voltage waveform for the various parts in this embodiment are substantially the same as those of the first embodiment as shown in FIG. 6, and the basic operation is also the same as in the first embodiment.

During the period of the read operation, the write/read mode signal WR goes to the ground potential level so that the transistor Q41 is always in the off-state, and the gate bias voltage Vgb of the transistor Q3 becomes Vb2+|Vt(Q42)| (the level in the nonselected state during the period of the write operations).

Further, during the period of the erase operation, the row selection signal RS is always at the nonselected level (the Vcc level) so that the transistor Q41 is always in the off-state, and the gate bias voltage Vgb becomes Vb3+ |Vt(Q42)|. Since the other basic operations and the effect are similar to those of the first embodiment, no further description will be given.

As described in the above, by adopting a configuration in which a bias control circuit which shifts the gate bias voltage, during the period of the write operation, of the transistor for blocking the erase voltage connected to a selected row line, to a voltage biased to the side of the write voltage than that in the row line nonselected state, it becomes possible to reduce the voltage between the gate and the source and the voltage between the gate and the drain of the transistor, at the time of row line selected state during the period of the write operation, than those in the conventional device. Therefore, it becomes possible to reduce the thickness of the gate oxide film of the above-mentioned transistor as well as the thickness of the transistor for blocking the write voltage which is formed in the same manufacturing step as the above-mentioned transistor. Accordingly, this invention has an effect of improving the current driving capability and the read operation speed of these transistors.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor memory device comprising, a word line which connected to a plurality of electrically writable and erasable memory cells, a first terminal which goes to an active level when said word line is selected, a second terminal which is applied with a read voltage during a read operation and with a write voltage which is higher than said read voltage during a write operation, a first transfer gate provided between said second terminal and a node, and having its control terminal coupled to said first terminal, an erasing voltage generation circuit which supplies an erasing control voltage to said word line during an erase operation, a transistor provided between said node and said word line, and a bias control circuit for supplying a gate of said transistor with a first bias voltage that renders said transistor non-conductive during said data erase operation, with a second bias voltage that renders said transistor conductive during said write operation and with a third bias voltage that renders said transistor conductive during said read operation, said second bias voltage being different from said third bias voltage.

2. The semiconductor memory device as claimed in claim 1, wherein said second bias voltage is smaller in absolute value than said third bias voltage.

3. The device as claimed in claim 1, wherein said second bias voltage is a ground voltage and said third bias voltage is a negative voltage.

4. The device as claimed in claim 1, wherein said first bias voltage is substantially equal to said first bias voltage.

5. The semiconductor memory device as claimed in claim 1, wherein said bias control circuit includes a bias controlling transistor which is provided between a second node, to which is applied a bias voltage which brings said transistor to the off-state during said period of data erase operation and brings said transistor to the on-state during said periods of write and read operations, and a third terminal, to which is supplied a voltage higher than the bias voltage for which said transistor is brought to the on-state, with the gate thereof being connected to said first terminal.

6. A semiconductor memory device comprising, a memory cell array formed by arranging a plurality of electrically writable and erasable memory cells in matrix form, a plurality of word lines provided in a row direction on said memory cell array and are connected to the prescribed plurality of said memory cells, a group consisting of a plurality of first terminals in which signals of active level are supplied corresponding to selected word lines among said plurality of word lines, a second terminal to which is applied a read voltage during the period of read operation and a write voltage which is higher than said read voltage during the period of write operation, a plurality of first transfer gates prepared respectively between said second terminal and a plurality of nodes provided corresponding to said plurality of word lines with the respective control terminals being connected to the respective first terminals corresponding to every one of said plurality of first terminals, a plurality of second transfer gates prepared respectively between said first terminal and a plurality of said node with the respective control terminals, a negative voltage generation circuit which supplies a negative voltage to said plurality of word lines during the period of data erase operation, a plurality of transistors provided respectively between said plurality of nodes and respective one ends of said plurality of word lines, and a plurality of bias control circuits which supply bias voltages that bring all of said plurality of transistors to the off-state during said period of data erase operation and bring all of said plurality of transistors to the on-state during said periods of write and read operations, wherein said bias control circuit is so set as to give the bias voltage generated when said corresponding first terminal is at the active level lower compared with the bias voltage generated when said first terminal is at the nonactive level.

7. The semiconductor memory device as claimed in claim 6, wherein said bias control circuit includes a bias controlling transistor provided between a second node, to which is applied a bias voltage which brings said transistor to the off-state during said period of data erase operation and brings said transistor to the on-state during said periods of write and read operations, and a third terminal, to which is supplied a voltage higher than the bias voltage for which said transistor is brought to the on-state, with the gate thereof being connected to said first terminal.

8. A semiconductor memory device comprising a memory cell array formed of field effect transistors which store prescribed information by receiving write voltages of prescribed levels to control gates during the period of write operation and erase stored information by receiving erase voltages having a polarity opposite to that of said write voltages to said control gates during the period of erase operation, and a plurality of electrically writable and erasable memory cells arrayed in row and column directions in matrix form, a plurality of row lines which select the memory cells of the memory cell array in the unit of a row and supply prescribed voltages to the control gates of the field effect transistors of the memory cells of corresponding row, an inverter circuit which receives a corresponding row selection signal and inverts its level, a first transistor which receives the write voltage or the read voltage to the source and goes to the on-state in response to the selected level of said row selection signal transmitted to the gate, a second transistor formed by connecting the source and the drain to the portion between the output end of the corresponding unit of said inverter circuit and the drain of said first transistor and receives a first bias voltage of a prescribed level to the gate, and goes to the off-state when said row selection signal is at the selected level and goes to the off-state when it is at the nonselected level, an erase voltage generation circuit which generates an erase voltage of a prescribed level and supplies it to the row line during the period of erase operation, a third transistor formed by connecting the source and the drain to the portion between the drain of the corresponding unit of said first transistor and said row line and goes to the on-state or the off-state in response to the gate bias voltage supplied to the gate, and a bias control circuit which brings said third transistor always to the on-state by receiving a second bias voltage and generates, when said row selection signal is at the selected level, said gate bias voltage more biased to the side of said write voltage than at the nonselected level, during the period of write operation and during the period of read operation, and generates said gate bias voltage which brings said third transistor to the off-state by receiving a third bias voltage during the period of erase operation.

* * * * *